United States Patent
Koh et al.

(10) Patent No.: US 6,767,787 B2
(45) Date of Patent: Jul. 27, 2004

(54) METHODS OF FORMING INTEGRATED CIRCUITS USING MASKS TO PROVIDE ION IMPLANTATION SHIELDING TO PORTIONS OF A SUBSTRATE ADJACENT TO AN ISOLATION REGION THEREIN

(75) Inventors: Gwan-byeob Koh, Seoul (KR); Ki-nam Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/891,905

(22) Filed: Jun. 26, 2001

(65) Prior Publication Data

US 2001/0054734 A1 Dec. 27, 2001

(30) Foreign Application Priority Data

Jun. 27, 2000 (KR) ............................................ 00-35707

(51) Int. Cl.[7] ..................... H01L 21/8242; H01L 21/20; H01L 27/108; H01L 29/76; H01L 29/94
(52) U.S. Cl. ...................... 438/247; 438/252; 438/395; 438/246; 257/296; 257/345
(58) Field of Search ................................ 438/246, 247, 438/252, 395; 257/296, 306, 345

(56) References Cited

U.S. PATENT DOCUMENTS

| 5,395,784 | A |   | 3/1995  | Lu et al. ......................... 437/52  |
| 6,008,085 | A | * | 12/1999 | Sung et al. .................. 438/253 |
| 6,165,825 | A | * | 12/2000 | Odake ......................... 438/217 |
| 6,329,233 | B1 | * | 12/2001 | Pan et al. .................... 438/199 |
| 6,359,301 | B1 | * | 3/2002  | Kuroda ........................ 257/306 |

FOREIGN PATENT DOCUMENTS

| JP | 60263430 | 12/1985 |
| JP | 10056147 | 2/1998 |

OTHER PUBLICATIONS

Official Action, Korean Application No. 10–2000–0035707, Jan. 28, 2002 (2 pages).

Daewon Ha et al.; Entitled *Self–Aligned Local Channel Implantation Using Reverse Gate Pattern for Deep Submicron Dynamic Random Access Memory Cell Transistors*, Japanese J. Applied Physics, vol. 37 (1998) pp 1059–1063.

* cited by examiner

*Primary Examiner*—Eddie Lee
*Assistant Examiner*—Samuel A Gebremariam
(74) *Attorney, Agent, or Firm*—Myers Bigel Sibley & Sajovec

(57) ABSTRACT

Methods of forming a channel region between isolation regions of an integrated circuit substrate are disclosed. In particular, a mask can be formed on an isolation region that extends onto a portion of the substrate adjacent to the isolation region to provide a shielded portion of the substrate adjacent to the isolation region and an exposed portion of the substrate spaced apart from the isolation region having the shielded portion therebetween. A channel region can be formed in the exposed portion of the substrate. Related integrated circuits are also discussed.

11 Claims, 6 Drawing Sheets

METHODS OF FORMING INTEGRATED CIRCUITS USING MASKS TO PROVIDE ION IMPLANTATION SHIELDING TO PORTIONS OF A SUBSTRATE ADJACENT TO AN ISOLATION REGION THEREIN

CLAIM FOR FOREIGN PRIORITY

This application claims priority to Korean Application No. 2000-35707, filed Jun. 27, 2000, the disclosure of which is hereby incorporated herein by reference.

FIELD OF THE INVENTION

The present invention relates to methods of forming integrated circuits and to integrated circuits in general, and more particularly, to methods of forming integrated circuit memory devices using ion implantation and to integrated circuits formed using same.

BACKGROUND

In dynamic random access memories (DRAMs), data can be recorded by storing charge in a capacitor of a memory cell. To keep data recorded in DRAMs, the data may need to be refreshed periodically. Data retention time is one of the characteristics used to determine the performance of DRAMs. One of the factors that influences data retention time is junction leakage current. Junction leakage current can be produced by an electric field at a pn junction boundary or by substrate defects in a depletion region. Decreasing the junction leakage current may increase data retention time and thereby improve the performance of DRAMs.

As the integration density of DRAMs increases, the size of a transistor included therein may decrease. Decreasing the size of a transistor may decrease the length of a channel region, thereby causing short channel effects such as a decrease in the threshold voltage $V_T$ of the transistor. A doping concentration can be increased gradually during channel ion-implantation to compensate for a decrease in $V_T$ and thereby adjust $V_T$ to a proper level.

FIG. 1 is a cross-sectional view of a conventional channel ion-implantation used to adjust $V_T$. A p-type dopant can be ion-implanted into an entire p-type integrated circuit substrate 10, including a isolation region 12, to form a doping region 20 without using an ion-implantation mask. Thereafter, a gate electrode 24 and an n-type source/drain region 26 can be formed.

When the channel ion-implantation is performed throughout the entire substrate 10, as shown in FIG. 1, the source/drain region 26 can be influenced by the doping region 20 formed by the channel ion-implantation. In this case, when the doping concentration is increased during the channel ion-implantation to prevent a short channel effect, substrate defects may occur between the isolation region 12 and the source/drain region 26 or in a depletion region.

Since the dopant implanted during the channel ion-implantation may have a polarity that is opposite a dopant that is ion-implanted into the source/drain region, an electric field at the pn junction boundary may be increased, thereby increasing junction leakage current. Consequently, data retention time may be decreased. Moreover, channel ion-implantation performed at a high concentration may increase junction capacitance. As a result, when charge stored in the capacitors of memory cells is read, the information may be affected by noise, so that a sensing margin is decreased.

FIGS. 2A and 2B are cross-sectional views that illustrate conventional channel ion-implantation to adjust $V_T$. A doping region 50 can be formed by implanting a p-type dopant 46 into only a region where a gate electrode 54 will be formed on an integrated circuit substrate 40, using a reverse gate pattern 44, formed of a photoresist film, as an ion-implantation mask. Thereafter, the gate electrode 54 can be formed on the doping region 50.

According to some conventional methods described with reference to FIGS. 2A and 2B, as the integration density of devices increases, it may become difficult to form the reverse gate pattern 44 used as a channel ion-implantation mask. In addition, when conventional methods are applied to the manufacturing of devices having a small pitch between gate electrodes 54, various problems can be caused by the misalignment of the mask or by variation in the critical dimension in a channel ion-implantation step or a gate electrode-patterning step followed by the channel ion-implantation step. For example, when the reverse gate pattern 44 is misaligned, the doping region 50 formed at the edge of an isolation region 42 may be affected by the junction leakage current. Accordingly, the operation of a device may be adversely affected.

In other conventional methods, channel ion-implantation can be performed using a reverse gate pattern as shown in FIG. 2A, and then a gate electrode may be formed to be self-aligned to the reverse gate pattern. However, in this method it may be difficult to form the structure of a gate electrode having multiple layers. In addition, processes of forming self-aligned contacts, such as a landing pad self-aligned with respect to a gate electrode may be impracticable.

SUMMARY OF THE INVENTION

Embodiments of methods according to the present invention may allow a channel region to be formed between isolation regions of an integrated circuit substrate. Pursuant to these embodiments, a mask can be formed on an isolation region that extends onto a portion of the substrate adjacent to the isolation region to provide a shielded portion of the substrate adjacent to the isolation region and an exposed portion of the substrate spaced apart from the isolation region having the shielded portion therebetween. A channel region can be formed in the exposed portion of the substrate.

In some embodiments according to the present invention, a first level of ions can be implanted in the shielded region adjacent to the isolation region. A second level of ions can be implanted in the channel region spaced apart from the isolation region, wherein the second level is greater than the first level.

In some embodiments according to the present invention, boron ions are implanted in the exposed region and then boron difluoride ions are implanted in the exposed region. In some embodiments according to the present invention, a gate electrode can be formed on the channel region and a contact can be formed on the shielded region. Source and drain regions can be formed in the channel region self aligned to the gate electrode.

DETAILED DESCRIPTION OF THE PRESENT INVENTION

Figure 1:
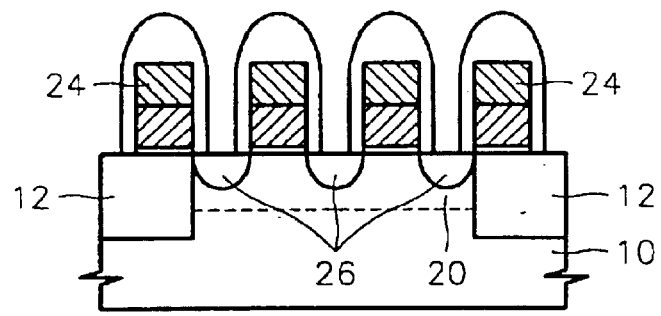
FIGS. 1, 2A and 2B are a cross-sectional views that illustrate conventional methods of forming channel regions in integrated circuit memory devices using ion implantation.
Figure 2A:
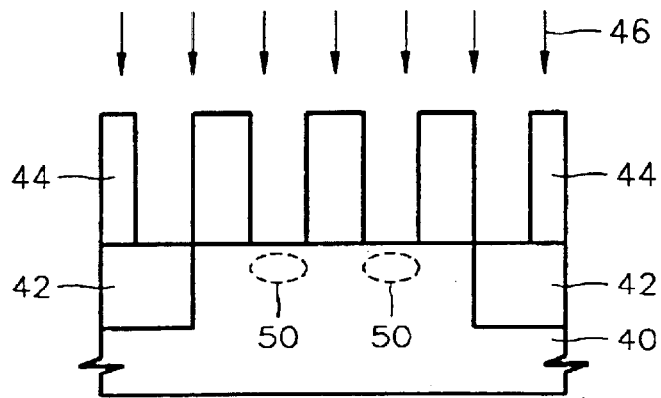
Figure 2B:
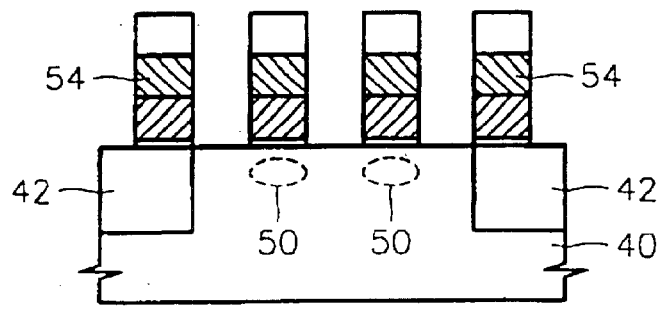

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will filly convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. Like numbers refer to like elements throughout.

Figure 3A:
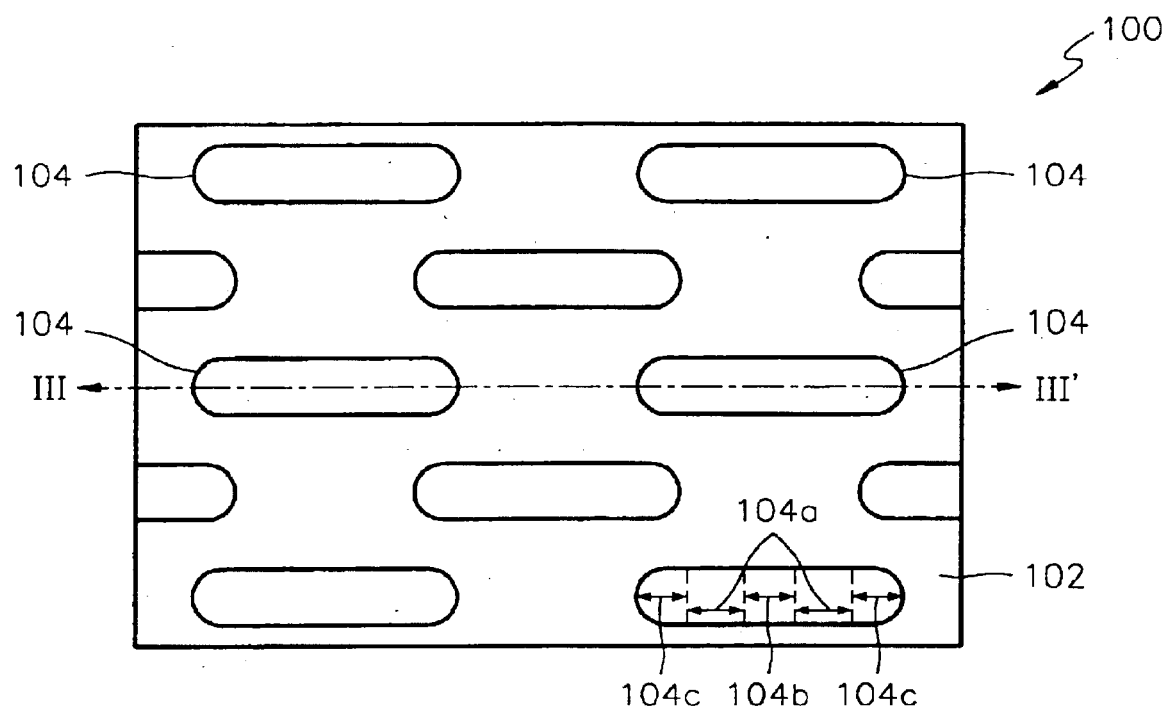
FIGS. 3A through 8 are diagrams that illustrate embodiments of methods for forming channel regions in integrated circuits and integrated circuit according to the present invention.
Figure 3B:
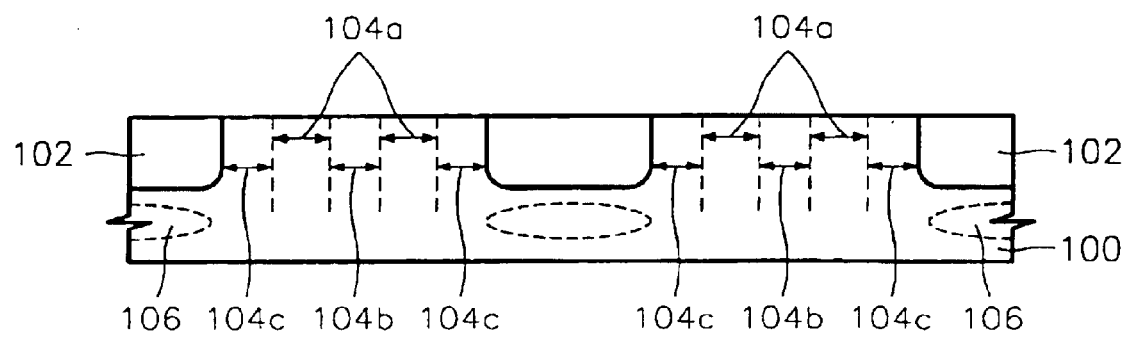

FIG. 3A is a top view of a integrated circuit substrate 100 in which an isolation region 102 is formed using a trench isolation method. FIG. 3B is a cross-sectional view of FIG. 3A taken along the line III-III'. As shown in FIGS. 3A and 3B, a well (not shown) and a channel stop layer 106 are formed in the integrated circuit substrate 100 using an ion-implantation method in which an active region 104 is defined by the isolation region 102. The active region 104 includes two portions 104a that are spaced apart from one another and on which gate electrodes can be subsequently formed. The active region 104 also includes two portions 104c each located between respective ones of the portions 104a and the isolation region 102 adjacent thereto and on which storage node contacts of a capacitor can be subsequently formed. The active region 104 further includes a portion 104b between the two portions 104a on which a bit line contact can be subsequently formed.

Figure 4A:
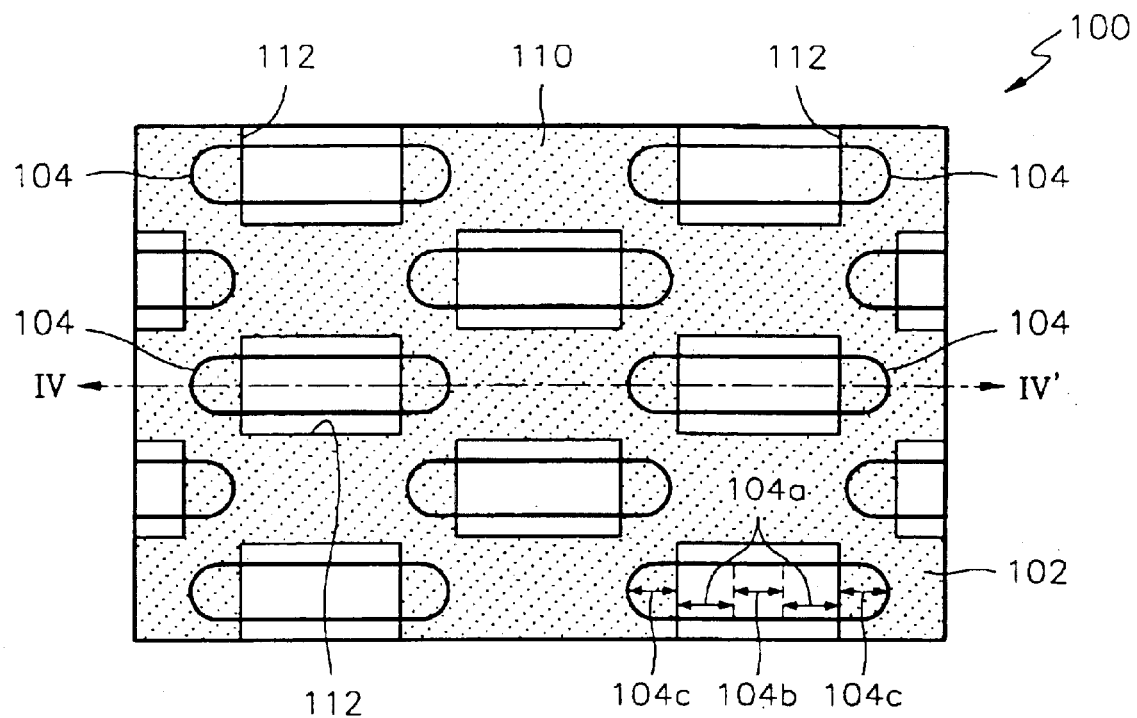
Figure 4B:
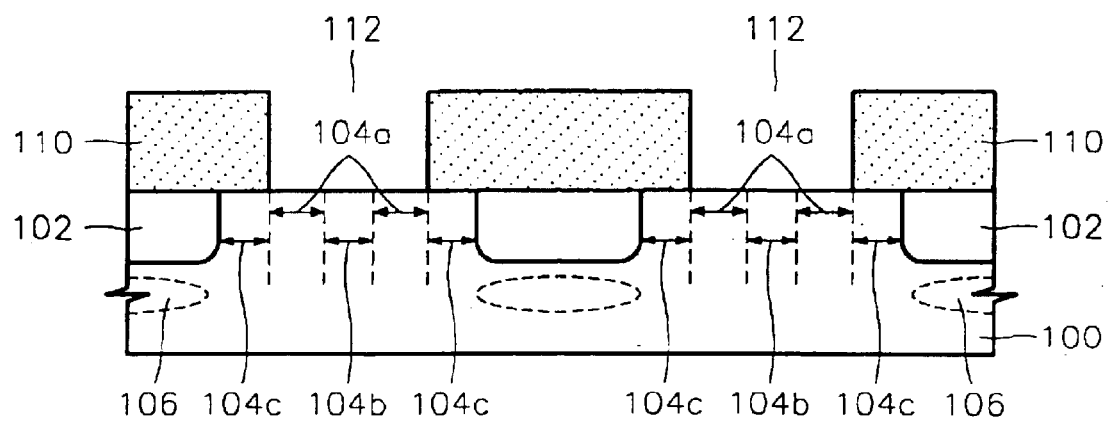

FIG. 4A is a top view of the integrated circuit substrate 100 including the isolation region 102 therein and having a channel ion-implantation mask 110 thereon. FIG. 4B is a cross-sectional view of FIG. 4A taken along the line IV-IV'. As shown in FIGS. 4A and 4B, the mask pattern 110 is formed on the isolation region 102 and extends onto a portion of the substrate 100 adjacent to the isolation region 102 to shield the portions 104c of the substrate 100 adjacent to the isolation region. In some embodiments, the shielded portions 104c of the substrate 100 extend about 0.4 mm microns beyond the isolation region 102 and may be controlled with a range of about 0.1 mm to 0.18 mm.

The mask pattern 110 also includes an opening 112 that exposes the portions 104a and 104b of the active region 104. The mask pattern 110 can be formed to completely shield the entire portion 104c. The mask pattern 110 can be formed, for example, of a photoresist film.

Figure 5:
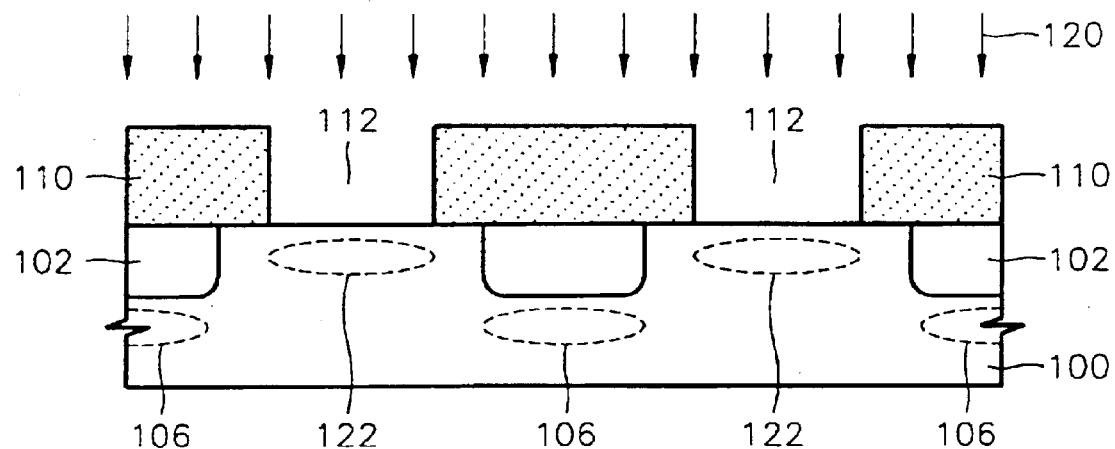

Referring to FIG. 5, a p-type dopant 120 is implanted into the integrated circuit substrate 100 using the mask pattern 110 as an ion-implantation mask, thereby forming a channel region 122 in the portions 104a and 104b of the active region 104. The p-type dopant 120 may be formed of boron ions or boron difluoride ions. The channel implantation may be performed two or more times to form the channel region 122. For example, a first channel ion-implantation can be performed using boron ions and a second local channel ion-implantation process can be performed thereafter using boron difluoride ions to form the channel ion-implantation region 122. In some embodiments of ion implantation according to the present invention, ion energies and ion implantation concentrations per unit area may be controlled. The substrate may have different ion concentration distributions depending on the depth of the substrate after an ion implantation process. Further, the ion concentration distributions in the substrate may be changed after a subsequent heat treatment. Thus, the level of ion concentration can be known accurately for the dimension ions/cm$^2$, and can be estimated for the dimension ions/cm$^3$. In some embodiment of the present invention, the first and second levels of ion concentrations resulting from a channel ion implantation can be about $1 \times 10^{17}$ ions/cm$^3$. The first and second levels of ion concentrations can be about $5 \times 10^{12}$ to $15 \times 10^{12}$ ions/cm$^2$.

Figure 6:
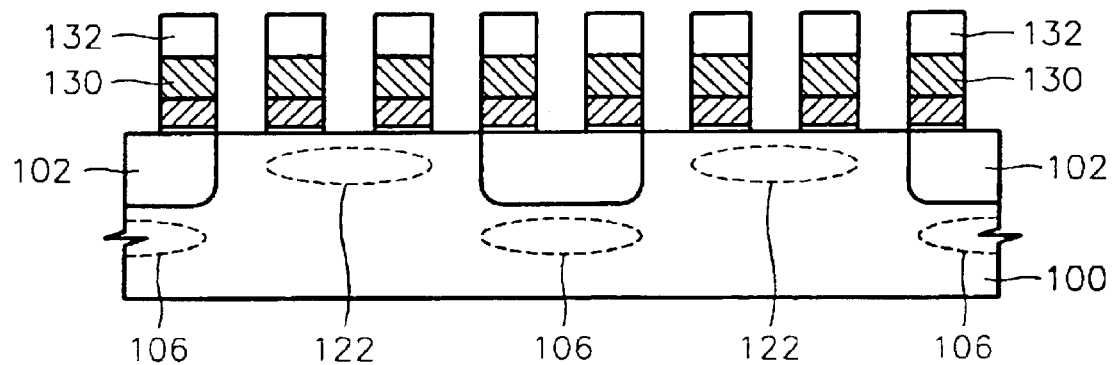

Referring to FIG. 6, the mask pattern 110 is removed, and a gate electrode 130 is formed on the portion 104a. A silicon nitride film pattern 132, which can be used as an etching mask to form the gate electrode 130, can remain on the upper surface of the gate electrode 130.

Figure 7:
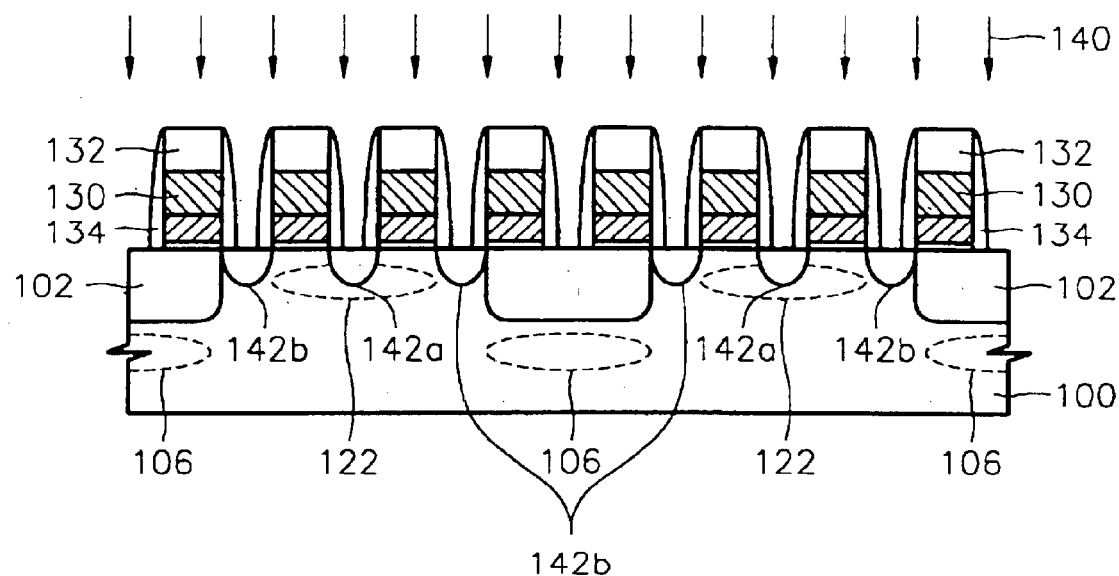

Referring to FIG. 7, a nitride spacer 134 is formed on the sidewalls of the gate electrode 130 and the silicon nitride film pattern 132. Thereafter, an n-type dopant 140 is ion-implanted into the integrated circuit substrate 100 to form source/drain regions 142a and 142b in the portions 104b and 104c, respectively. It will be understood by those having skill in the art that the source/drain regions 142a and 142b can be formed to have a lightly doped drain (LDD) structure.

A contact plug for connecting the source/drain region 142a to a bit line is formed on the source/drain region 142a, and a contact plug for connecting the source/drain region 142b to a storage node of a capacitor is formed on the source/drain region 142b. As illustrated in FIG. 5, the channel region 122 is positioned below the two gate electrodes 130 and a bit line contact, which is formed in the portion 104b between the two gate electrodes 130, but is not positioned below a storage node contact of a capacitor formed in the portion 104c. Accordingly, the effect of the channel ion-implantation on the source/drain region 142b may be reduced. Therefore, damage from the channel ion-implantation (and/or an increase in junction leakage current or junction capacitance) due to an increase in an electric field can be prevented, thereby increasing data retention time. Junction leakage current may be produced in the source/drain region 142a below the bit line contact due to the effect of the channel ion-implantation region 122, but the effects of such leakage current can be ignored.

Figure 8:
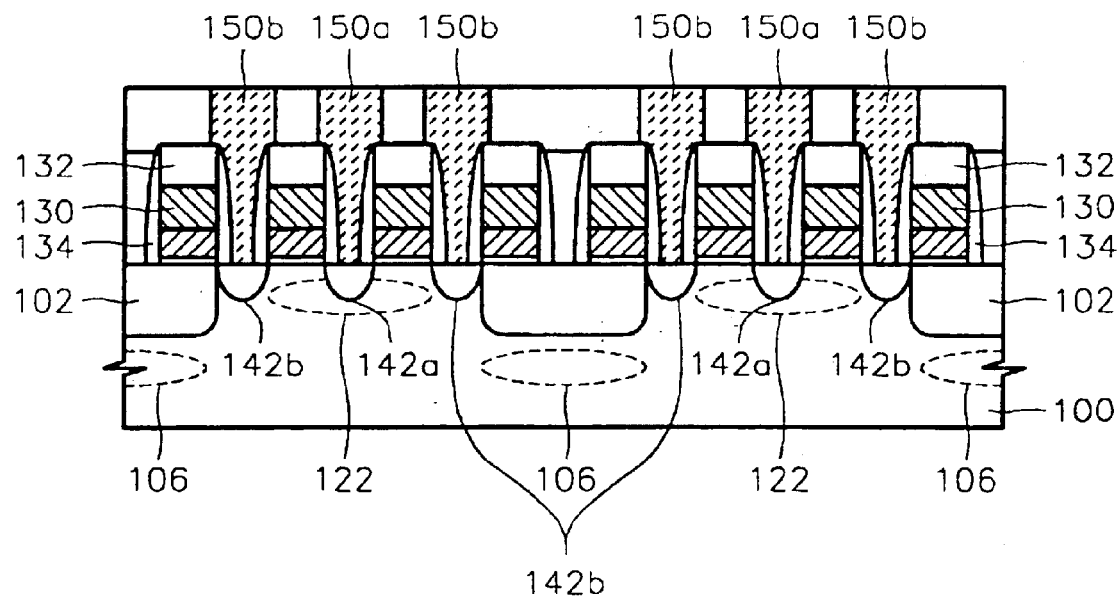

Referring to FIG. 8, a contact plug 150a is formed on the portion 104b to connect to the source/drain region 142a, and a contact plug 150b is formed on the portion 104c to be connected to the source/drain region 142b. Each of the contact plugs 150a and 150b is formed self-aligned to each gate electrode 130. The contact plug 150a connects the source/drain region 142a to a bit line, and the contact plug 150b connects the source/drain region 142b to a storage node of a capacitor.

As described above, according to embodiments of methods of forming integrated circuits, the source/drain region 142b may not be influenced by channel ion-implantation used to adjust $V_T$ of a transistor to a proper level, thereby decreasing junction leakage current. Consequently, sheet resistance at a junction area can be decreased so that the saturation current of a transistor can be increased. In addition, junction capacitance can be decreased so that the floating capacitance of the bit line can be decreased.

Figure 9:
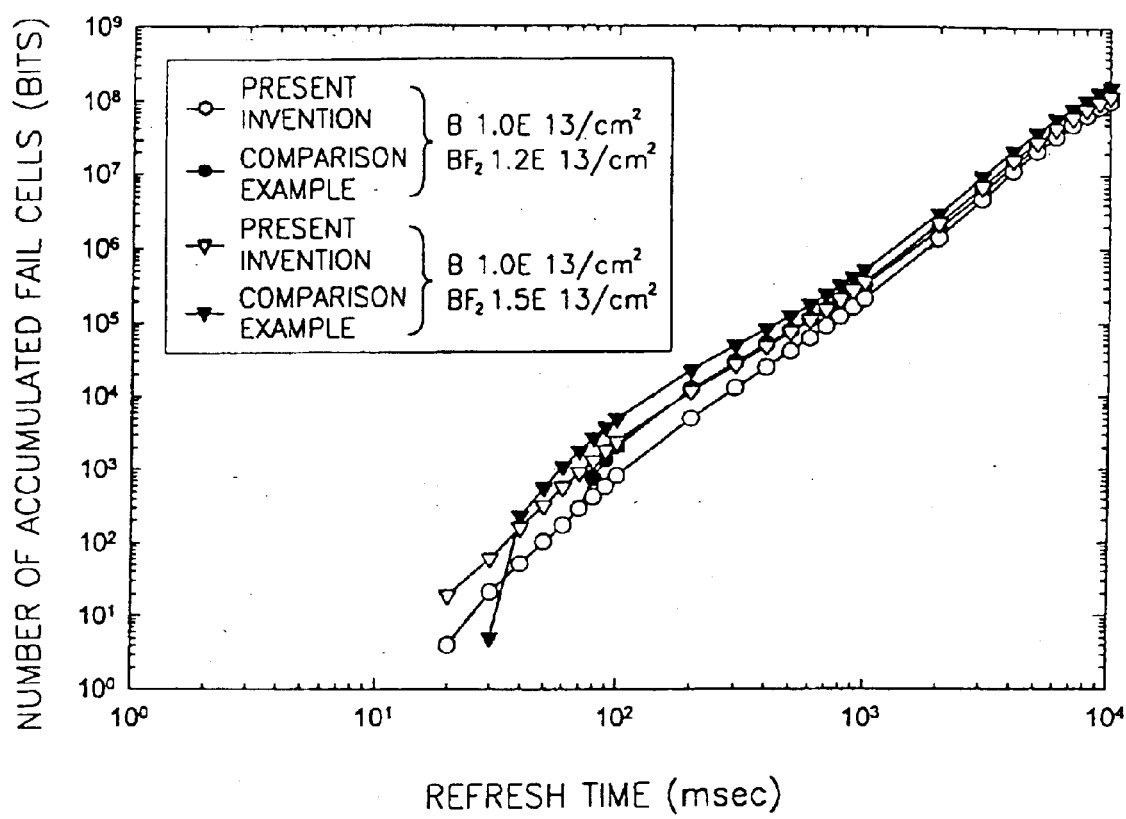
FIG. 9 is a graph that illustrates electrical characteristics of integrated circuits formed using embodiments of methods according to the present invention and conventional integrated circuits.

FIG. 9 is a graph illustrates the electrical characteristics of integrated circuit memory devices formed using embodiments of methods according to the present invention. An integrated circuit memory device according to the present invention, as shown in FIG. 8, was used to obtain the estimated results shown in FIG. 9.

During channel ion-implantation, boron ions were implanted into a portion over which a gate electrode would be formed and into a portion where a source/drain region connected to a bit line contact would be formed in an active region at a dose of about $1.0E13/cm^2$ and with ion-implantation energy of about 30 KeV in a first local ion-implantation step. Then boron difluoride ions were implanted into the portion over which the gate electrode would be formed and the portion where the source/drain region connected to the bit line contact would be formed in the active region at a dose of about $1.2E13/cm^2$ and with ion-implantation energy of about 30 KeV in a second local ion-implantation process. This case is represented by -O- in the graph of FIG. 9. In another case, dual channel ion-implantation was performed under the same conditions as the above case, but channel ion-implantation was performed on an entire active region as in the prior art described in FIG. 1. This case is represented by ● in the graph of FIG. 9. The two cases are represented by the numbers of accumulated failed cells according to refresh time.

In addition, during channel ion-implantation, boron ions were implanted into a portion over which a gate electrode would be formed and into a portion where a source/drain region connected to a bit line contact would be formed in an active region at a dose of about $1.0E13/cm^2$ and with ion-implantation energy of about 30 KeV in a first local ion-implantation step, and then boron difluoride ions were implanted into only the portion over which the gate electrode would be formed and the portion where the source/drain region connecting to the bit line contact would be formed in the active region at a dose of about $1.5E13/cm^2$ and with ion-implantation energy of about 30 KeV in a second local ion-implantation process. This case is represented by -V- in the graph of FIG. 9. In another case, dual channel ion-implantation was performed under the same conditions as the above case, but the channel ion-implantation was performed on an entire active region as in the prior art described in FIG. 1. This case is represented by ▼ in the graph of FIG. 9. The two cases are represented by the numbers of accumulated failed cells according to refresh time.

As shown in FIG. 9, the number of failed cells in an integrated circuit memory device manufactured by local channel ion-implantation on an active region according to the present invention can be reduced by about 20–30% compared to a integrated circuit memory device formed using conventional channel ion-implantation throughout an active region according to a conventional method.

In embodiments of methods of forming integrated circuit memory devices according to the present invention, a mask pattern can be formed to include an opening which exposes a portion of the substrate where a gate electrode is formed and a portion where a source/drain region connected to a bit line contact is formed in an active region of a integrated circuit substrate. Ions can be implanted through the mask to adjust $V_T$ of a cell transistor to a proper level. A source/drain region connected to a storage node contact of a capacitor, may not be affected by the channel ion-implantation. As a result, damage to a substrate or an increase in junction leakage current due to an increase in an electric field can be reduced near a source/drain region connected to a storage node contact. In addition, sheet resistance in a junction area can be reduced, thereby increasing the saturation current of a cell transistor, and junction capacitance can be reduced, thereby decreasing the floating capacitance of a bit line.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. A method of forming a channel region between isolation regions of an integrated circuit substrate, the method comprising:

forming a mask on the isolation region that extends onto a portion of the substrate adjacent to the isolation region to provide a shielded portion of the substrate adjacent to the isolation region and an exposed portion of the substrate spaced apart from the isolation region having the shielded portion therebetween, the exposed portion of the substrate comprising a first portion where a gate electrode will be subsequently formed and a second portion where a bit line contact will be subsequently formed, the mask exposing only the first and second portions;

implanting ions into the exposed portion of the substrate using the mask as an implant mask, thereby forming a channel region in only the first and second portions to adjust the threshold voltage of a transistor;

forming a plurality of gate electrodes on the channel region; and implanting ions using the plurality of gate electrodes as an implant mask to form source/drain regions associated with the plurality of gate electrodes and to define separate channel regions between adjacent isolation regions associated with the plurality of gate electrodes from the channel region that are self-aligned to the plurality of gate electrodes.

2. A method according to claim 1 wherein the forming the channel region comprises:

implanting a first concentration of ions in the shielded region adjacent to the isolation region; and wherein the implanting ions comprises implanting a second concentration of ions in the channel region spaced apart from the isolation region, wherein the second concentration is greater than the first concentration.

3. A method according to claim 1 wherein the forming a channel region comprises implanting boron ions in the exposed portion.

4. A method according to claim 1 wherein at least one of the source/drain regions is in the exposed portion.

5. A method according to claim 1 wherein the implanting ions comprises:

implanting first ions of first conductive type; and implanting second ions of second conductive type.

6. A method according to claim 5 wherein the implanting first ions and second ions comprises:

implanting boron ions to provide a first concentration of ions of about $1 \times 10^{17}$ ions/cm$^3$.

7. A method according to claim 1 wherein the source/drain regions comprise lightly doped source/drain structures.

8. A method of forming a channel region between isolation regions of an integrated circuit substrate, the method comprising:

forming a mask on first and second adjacent isolation regions in an integrated circuit substrate and extending onto an active area between the first and second adjacent isolation regions to define first and second shielded portions of the substrate adjacent to the first and second isolation regions and an exposed portion of the substrate therebetween, the exposed portion of the substrate comprising a first portion where a gate electrode will be subsequently formed and a second portion where a bit line contact will be subsequently formed, the mask exposing only the first and second portions;

implanting ions into the exposed portion of the substrate using the mask as an implant mask, thereby forming a single channel region in only the first and second portions to adjust the threshold voltage of a transistor;

forming a plurality of gate electrodes on the single channel region; and implanting ions using the plurality of gate electrodes as an implant mask to form source/drain regions associated with the plurality of gate electrodes and to form first and second spaced apart channel regions between adjacent isolation regions associated with the plurality of sate electrodes from the single channel region.

9. A method according to claim 8 wherein the implanting ions comprises implanting ions to form the first and second spaced apart channel regions self-aligned to the plurality of gate electrodes.

10. A method according to claim 8 wherein forming a single channel region comprises implanting boron ions in the exposed portion.

11. A method of forming a channel region between isolation regions of an integrated circuit substrate, the method comprising:

forming a mask on the isolation region that extends onto a portion of the substrate adjacent to the isolation region to provide a shielded portion of the substrate adjacent to the isolation region and an exposed portion of the substrate spaced apart from the isolation region having the shielded portion therebetween;

implanting ions into the exposed portion of the substrate using the mask as an implant mask, thereby forming a channel region in the exposed portion of the substrate to adjust the threshold voltage of a transistor; then forming a plurality of gate electrodes on the channel region; and implanting ions using the plurality of gate electrodes as an implant mask to form source/drain regions associated with the plurality of gate electrodes and to define separate channel regions between adjacent isolation regions associated with the plurality of gate electrodes from the channel region that are self-aligned to the plurality of gate electrodes.

\* \* \* \* \*

UNITED STATES PATENT AND TRADEMARK OFFICE
CERTIFICATE OF CORRECTION

PATENT NO. : 6,767,787 B2
DATED : July 27, 2004
INVENTOR(S) : Koh et al.

It is certified that error appears in the above-identified patent and that said Letters Patent is hereby corrected as shown below:

Column 6,
Line 10, should read -- A method of forming a plurality of channel regions between isolation --
Lines 26 and 27, should read -- using the mask as an implant mask, thereby forming an implant region in only the first and second portions to --
Line 29, should read -- forming a plurality of gate electrodes on the implant --
Lines 34-37, should read -- from the implant region, wherein the separate channel regions are self-aligned to the plurality of gate electrodes. --
Line 62, should read -- 8. A method of forming a plurality of channel regions between isolation --

Column 7,
Line 11, should read -- single implant region in only the first and second --
Line 14, should read -- implant region; and --
Lines 19-21, should read -- and second spaced apart channel regions from the single implant region. --

Column 8,
Line 1, should read -- A method of forming a plurality of channel regions between --
Lines 13-14, should read -- using the mask as an implant mask, thereby forming an implant region in the exposed portion of the substrate --
Line 16, should read -- forming a plurality of gate electrodes on the implant --
Lines 22-26, should read -- separate channel regions from the implant region, wherein the separate channel regions are self-aligned to the plurality of gate electrodes. --

Signed and Sealed this

First Day of February, 2005

JON W. DUDAS
*Director of the United States Patent and Trademark Office*